US012568674B2

(12) United States Patent
Bo et al.

(10) Patent No.: US 12,568,674 B2
(45) Date of Patent: Mar. 3, 2026

(54) SEMICONDUCTOR LASER ANNEAL FABRICATION AND SYSTEM

(71) Applicant: Texas Instruments Incorporated, Dallas, TX (US)

(72) Inventors: Xiangzheng Bo, Plano, TX (US); Huang-Chun Wen, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 773 days.

(21) Appl. No.: 17/538,726

(22) Filed: Nov. 30, 2021

(65) Prior Publication Data

US 2023/0170256 A1 Jun. 1, 2023

(51) Int. Cl.
H01L 21/77 (2017.01)
B23K 26/082 (2014.01)
B23K 26/32 (2014.01)
B23K 101/40 (2006.01)

(52) U.S. Cl.
CPC ............ H01L 21/77 (2013.01); B23K 26/082 (2015.10); B23K 26/32 (2013.01); B23K 2101/40 (2018.08)

(58) Field of Classification Search
None
See application file for complete search history.

(56) References Cited

U.S. PATENT DOCUMENTS

| | | | | |
|---|---|---|---|---|
| 2010/0240227 A1* | 9/2010 | Gluschenkov | ..... | H10D 30/0227 257/E21.333 |
| 2011/0239421 A1* | 10/2011 | Tertitski | ............. | B23K 26/0876 29/25.01 |
| 2013/0026543 A1* | 1/2013 | Yang | ..................... | H01L 21/268 257/213 |
| 2014/0004627 A1* | 1/2014 | Shen | ................... | H01L 21/2636 219/121.6 |
| 2017/0205653 A1* | 7/2017 | Qian | ....................... | G02F 1/136 |

\* cited by examiner

*Primary Examiner* — Brent A. Fairbanks
*Assistant Examiner* — Derek L Nielsen
(74) *Attorney, Agent, or Firm* — Yudong Kim; Frank D. Cimino

(57) ABSTRACT

A method of forming an integrated circuit is described. The method first positions a semiconductor wafer in a processing chamber, and second, laser anneals at least a portion of the semiconductor wafer. The laser annealing includes tracing a first laser beam, in a first path having a first direction, across the at least a portion of the semiconductor wafer, tracing a second laser beam, in a second path having a second direction, opposite to and colinear with the first direction, across the at least a portion of the semiconductor wafer.

20 Claims, 9 Drawing Sheets

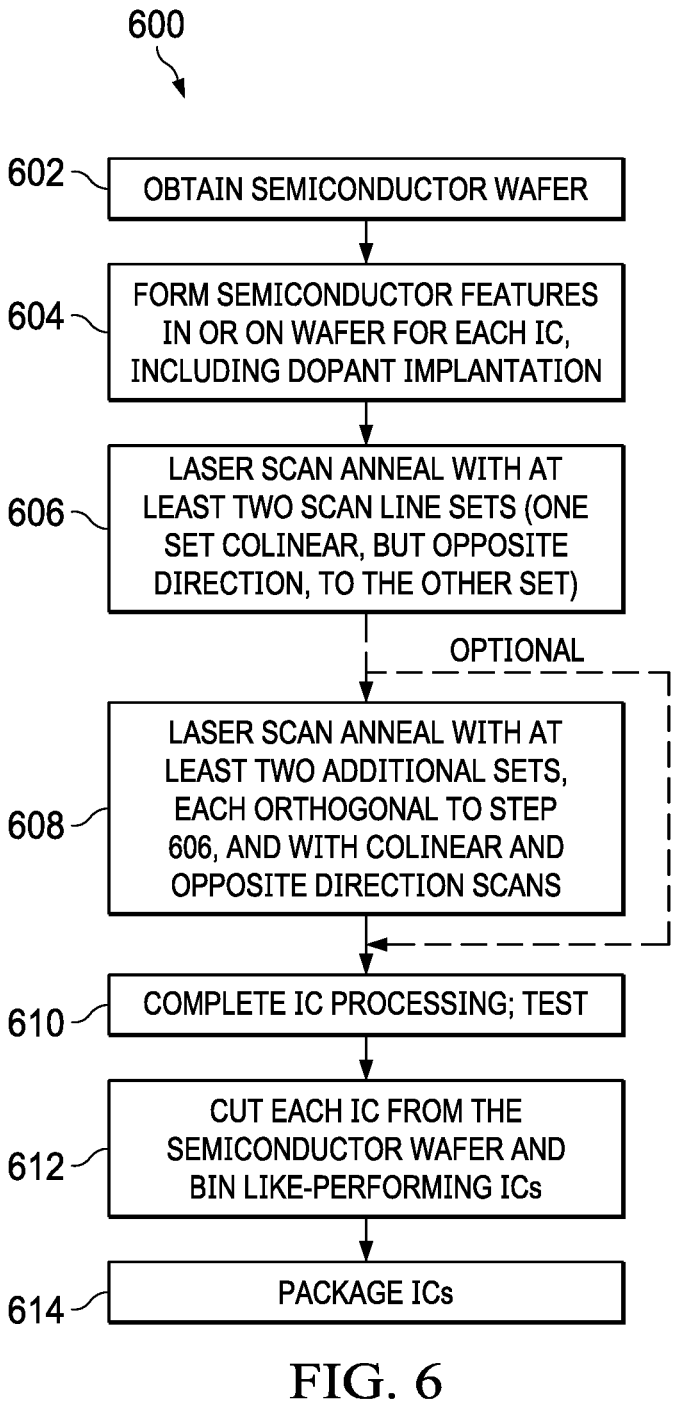

600

602 — OBTAIN SEMICONDUCTOR WAFER

604 — FORM SEMICONDUCTOR FEATURES IN OR ON WAFER FOR EACH IC, INCLUDING DOPANT IMPLANTATION

606 — LASER SCAN ANNEAL WITH AT LEAST TWO SCAN LINE SETS (ONE SET COLINEAR, BUT OPPOSITE DIRECTION, TO THE OTHER SET)

OPTIONAL

608 — LASER SCAN ANNEAL WITH AT LEAST TWO ADDITIONAL SETS, EACH ORTHOGONAL TO STEP 606, AND WITH COLINEAR AND OPPOSITE DIRECTION SCANS

610 — COMPLETE IC PROCESSING; TEST

612 — CUT EACH IC FROM THE SEMICONDUCTOR WAFER AND BIN LIKE-PERFORMING ICs

614 — PACKAGE ICs

FIG. 6

SEMICONDUCTOR LASER ANNEAL FABRICATION AND SYSTEM

CROSS-REFERENCE TO RELATED APPLICATION

Not applicable.

BACKGROUND

The example embodiments relate to semiconductor fabrication, for example with respect to laser annealing structures in integrated circuits (ICs).

Semiconductor ICs pervade all manners of electronic devices, and efforts to improve operation, reliability, consistency, and cost/yield have been and are a part of past and ongoing evolution of these devices. In semiconductor fabrication, annealing, and in some instances laser annealing, has been used for example in advanced complementary metal-oxide semiconductor (CMOS) technologies. Laser annealing, sometimes referred to as laser spike annealing (LSA), typically activates CMOS dopants, can be used to achieve more precise boundaries such as shallow and abrupt junctions, and can correct implant damage, for example at longer annealing durations.

While laser annealing provides certain benefits, it also may include some limitations. For example, the laser light diffraction near thin film or other circuit feature boundaries has been observed to create optical intensity oscillations or other pattern interference in the laser light, as may occur where an illuminated area has attributes that measure smaller than the laser light wavelength. The optical intensity oscillation will eventually stabilize through heat diffusion, but thereafter a residual temperature gradient is created. Accordingly, depending on the local thin-film or other boundary conditions, the amount of heat generated by the beam varies and that variance correspondingly impacts the amount of dopant activation. The dopant activation variance may result in undesirable resistance variations (mismatch) in the IC active and/or polysilicon layers. Indeed, component-to-component 'matching' requirements in some circuits are critical, such as in analog circuit designs, and certain other circuits components, such as bandgap, also have relatively high component accuracy requirements.

Accordingly, there may be a need to provide IC fabrication annealing, and this document provides example embodiments that may improve on certain of the above concepts, as detailed below.

SUMMARY

A method of forming an integrated circuit is described. The method comprises, first, positioning a semiconductor wafer in a processing chamber, and second, laser annealing at least a portion of the semiconductor wafer. The laser annealing includes tracing a first laser beam, in a first path having a first direction, across the at least a portion of the semiconductor wafer, tracing a second laser beam, in a second path having a second direction, opposite to and colinear with the first direction, across the at least a portion of the semiconductor wafer.

Other aspects are also described and claimed.

BRIEF DESCRIPTION OF THE DRAWINGS

FIG. 6 illustrates a flow diagram of an example embodiment method 600 for manufacturing the FIG. 2 IC 200.

DETAILED DESCRIPTION

Figure 1:
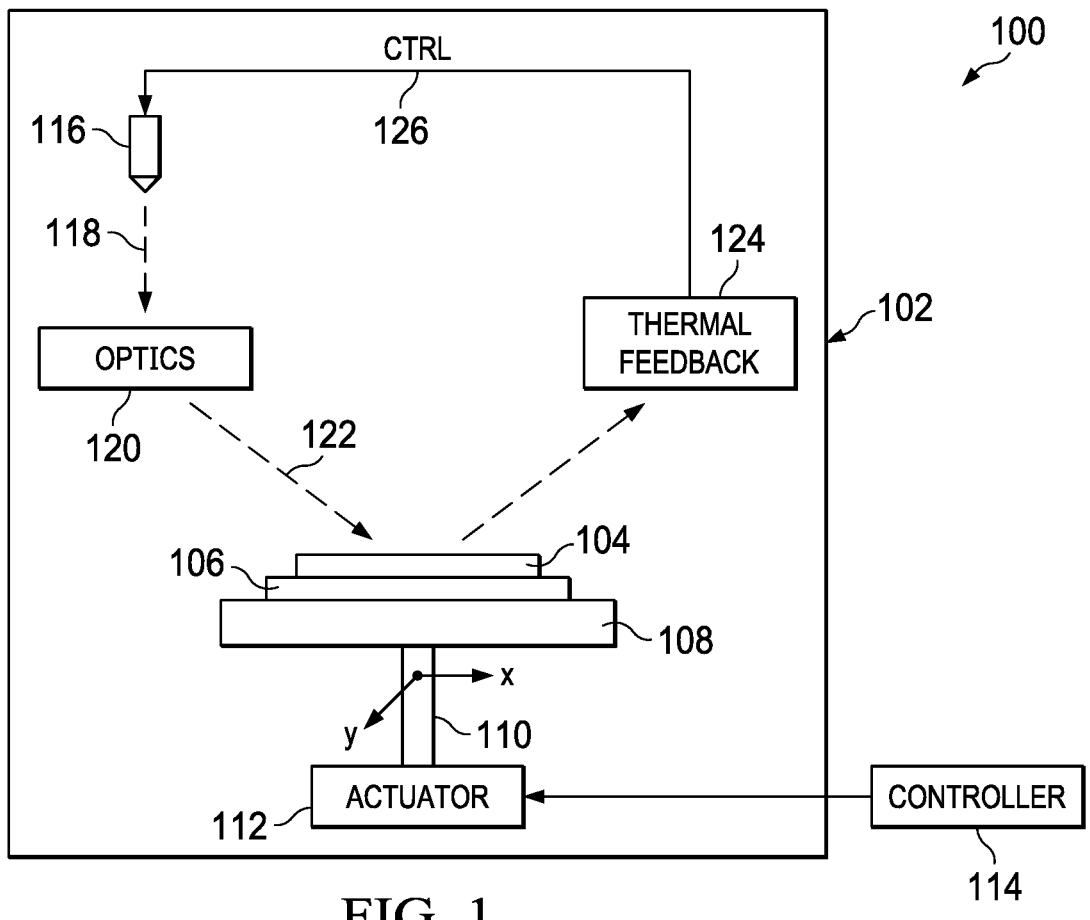
FIG. 1 is a block diagram of an IC fabrication system.

FIG. 1 is a block diagram of portions of an IC fabrication system 100, as relating to laser annealing, so other aspects unrelated to annealing are not illustrated. The system 100 has some attributes known in the art, but is improved as further detailed in this document. In an example embodiment, the system 100 is a single wafer processing system, which is operable to process a single IC semiconductor wafer at a time, and in contrast to batch systems that concurrently process plural wafers. The system 100 includes a chamber 102, with various internal components for fabrication processes related to a semiconductor (e.g., silicon) wafer 104. While not shown, separate apparatus (e.g., a robotic handler and a passageway) may be associated with the chamber 102 for positioning the semiconductor wafer 104 as shown and also for subsequently removing the semiconductor wafer 104 from the chamber 102. The semiconductor wafer 104 also may be positioned in cooperation with other apparatus, for example as received from a wafer cassette or a front opening unified (or universal) pod (FOUP). The semiconductor wafer 104 also may travel to various other locations for processing, for example for additional steps before and/or after being processed in the chamber 102 (e.g., nitriding, polysilicon deposition, and the like).

The semiconductor wafer 104 is positioned relative to various supporting and movable structures. These structures include, for example, an edge ring 106 or other apparatus for retaining the semiconductor wafer 104 in place, which retention can be by physical apparatus or, for example, by vacuum. The edge ring 106 couples to a chuck 108, where the chuck 108 may include a heat source/element (not separately shown) for imparting heat to the semiconductor wafer 104. The chuck 108 is connected via a member 110 (e.g., shaft) to an actuator 112, and the actuator 112 is operable to move the member 110 in at least two dimensions, which FIG. 1 shows in an x-y plane that is generally horizontal in the FIG. 1 side perspective view. Accordingly, as the actuator 112 moves the member 110, a corresponding directional move occurs for the chuck 108 and the semiconductor wafer 104. The actuator 112 is controlled by a controller or plural controllers 114. The controller(s) 114 are programmable/computational devices, known in the art, and include various manners of hardware and software for controlling semiconductor wafer processing. For example, the hardware may include a microprocessor (including a digital signal processor) or microcontroller, computer readable media such as memory, or access to memory, for reading/writing data and programming, and communications (including networking) interfaces for input/output, for example including a user interface through which a user can input, or choose, and execute wafer processing parameters, sometimes referred to in part as a recipe. The software, associated with and stored in the computer readable media of, the controller(s) 114, provides program instructions to the controller 114, so as to control various processing steps described in this document.

FIG. 1 also illustrates apparatus more directly related to annealing the semiconductor wafer 104. Such apparatus include a laser (or plural lasers) 116, having appropriate parameters, for example wavelength, range, and resolution (angular and distance), for imparting a laser annealing beam 118 suitable for semiconductor laser annealing. The laser annealing beam 118 is directed to an optics block 120, which may include various optical structures, such as beam splitting and/or or reflectors, to provide a resultant output beam 122 directed toward the semiconductor wafer 104. The resultant output beam 122 is sometimes referred to as an incident beam, and its angle of approach/incidence with a surface of the semiconductor wafer 104 may be controlled, for example, by movement of one or more parts in the system 100. In examples described below, where the output beam 122 makes contact with, and continues to traverse along, the semiconductor wafer 104 is referred to as a scan (or scan line), with it understood that the scan is intended as the trace (illuminated path) along the semiconductor wafer 104 that is traversed by the output beam 122, as may be accomplished, for example, by keeping the output beam 122 (and its incident angle) in one place, while moving the semiconductor wafer 104. For example, the semiconductor wafer 104 can be moved in only one of either the x-dimension or y-dimension at a time, creating a linear trace across the semiconductor wafer 104, or alternatively the semiconductor wafer 104 can be moved in both the x-dimension or y-dimension at a time, to create a non-linear trace, for example as an arc or the like to generally parallel a portion of the outer circumference of the semiconductor wafer 104. Further, the annealing-related apparatus also may include thermal feedback componentry 124, for example to sense or detect heat imparted to, or reflected from, the semiconductor wafer 104, with the thermal feedback componentry 124 providing a feedback control signal (CTRL) 126 to the laser 116, so as to control the energy the laser 116 emits in the laser annealing beam 118. While not shown, the thermal feedback componentry 124 may be coupled to the controller 114, as may other devices included in, or related to, the IC fabrication system 100.

Figure 2:
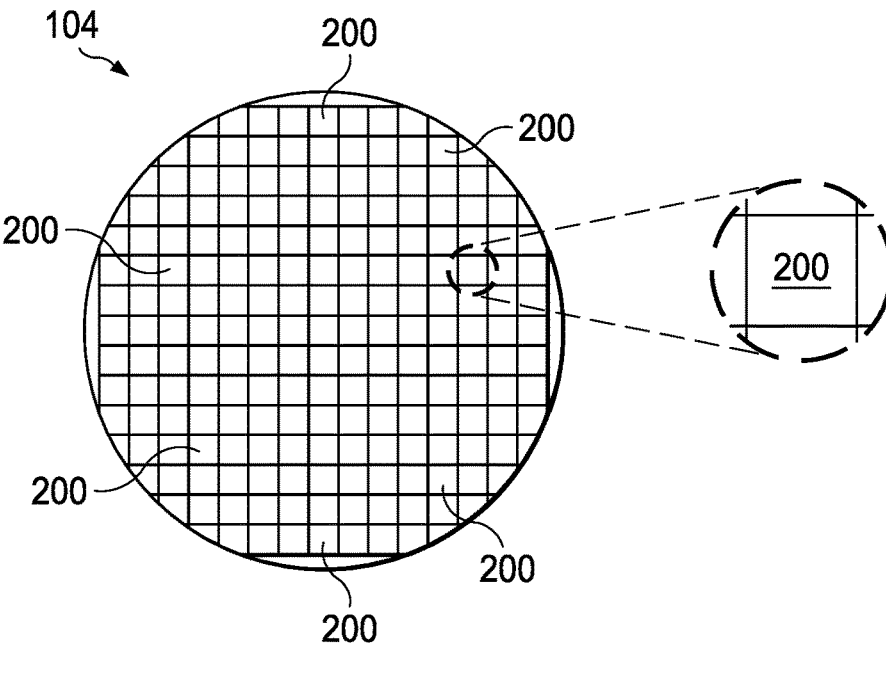
FIG. 2 is a plan view of the FIG. 1 semiconductor wafer.

FIG. 2 is a plan view of the FIG. 1 semiconductor wafer 104. Portions of the semiconductor wafer 104 are concurrently and/or sequentially processed to form respective same-shaped regions, each providing a respective integrated circuit (IC) 200, only some of which are labeled in FIG. 2 to simplify the Figure. In an example embodiment, each IC 200 may be either a standalone circuit or an IC having many devices and functionality, where in either case the example embodiment IC 200 includes dopant implanted devices, such as transistors or resistors, the latter including a polysilicon resistor known as a "zero temperature-coefficient of resistance" (ZTCR) resistor, which is also sometimes referred to as having zero tempco, meaning low and little or no variability in resistance over a certain temperature range. These and other dopant implant devices are to be laser annealed in the FIG. 1 chamber 102, for example to further activate those dopants post-implantation, and desirably for the example embodiments to render the activation relatively consistent across the semiconductor wafer 104, that is, for each of the viable IC 200s in the semiconductor wafer 104.

Figure 3:
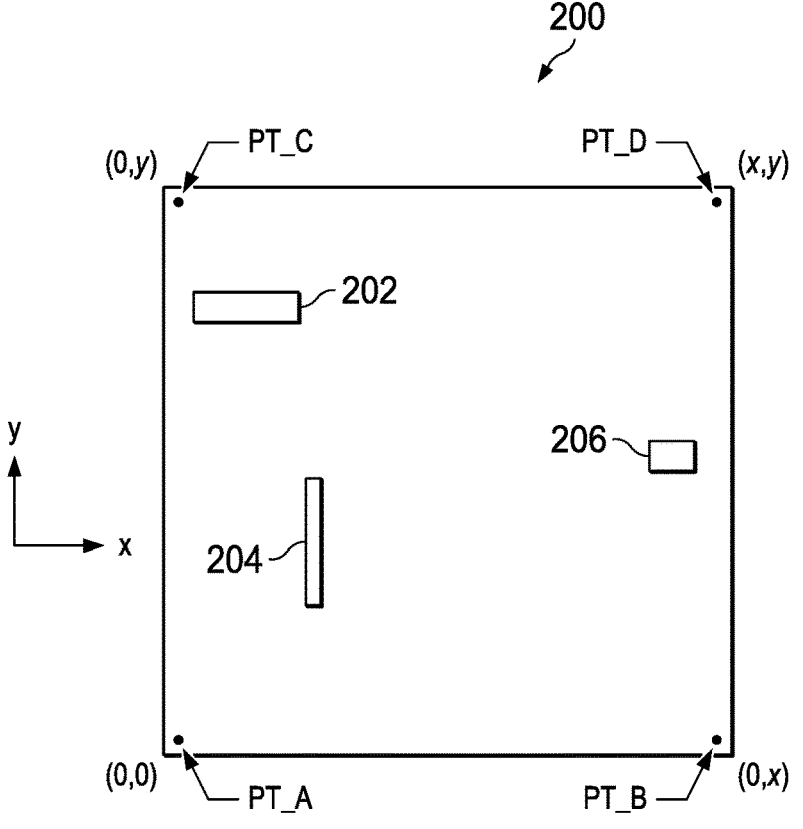
FIG. 3 illustrates a singular IC.

FIG. 3 illustrates a singular FIG. 2 IC 200, generally as a rectangle (to include a square) and for sake of reference with four illustrated points, each slightly within a nearby edge created vertex. For sake of reference, and using the same FIG. 1 x-y plane reference, the four points include: (i) a point PT A near a reference origin (0, 0); (ii) a point PT_B near a far x-dimension point (0, x); (iii) a point PT_C near a far y-dimension point (0, y); and (iv) a point PT_D near both a far x-dimension and a far y-dimension point (x, y). Also, as examples, FIG. 3 shows three different circuit features, a first feature 202, a second feature 204, and a third feature 206, each of which may include one or more circuit elements, either in partial or completed form. These features, as well as the illustration points and bases of reference, are carried forward in additional figures and discussion below, in connection with example embodiments that operate the FIG. 1 IC fabrication system 100 to implement alternative manners of laser annealing, where such annealing impinges the annealing energy along each of the features.

FIGS. 4A through 4D, and 5A through 5D, each illustrate the FIG. 3 IC 200, along with a corresponding scan set of laser scan lines SL(i) across the IC 200. Each scan line SL(i), of each scan set, is a path traversed by the laser annealing energy, as achieved using the FIG. 1 IC fabrication system 100, that is, the path along the FIG. 1 resultant output beam 122, as influenced for example by emissions from the laser 116 and directed by the optics block 120. Again, the directionality of each scan line SL(i) across the IC 200 may be achieved, for example, by the movement of the semiconductor wafer 104, under control of the controller 114 and with the intervening apparatus, for example including the edge ring 106, the chuck 108, and the member 110. Alternative example embodiments may direct the laser light in other manners. Further, while each scan line is stated to be parallel with respect to the others, such an approach is by example and may be relative to a relatively small, localized portion of the semiconductor wafer 104. In particular, a given scan may trace across a majority, or the entirety, of the semiconductor wafer 104, and along the total length of that trace its scan shape may have some curvature; generally, however, within the localized portion of each individual IC region of the semiconductor wafer 104, the scan path is a straight line. Other examples, however, may implement a scan line with some non-linearity of the path, even within the localized IC area, so the use of scan "line" is not intended to be necessarily limiting to a path that is linear.

Figure 4B:
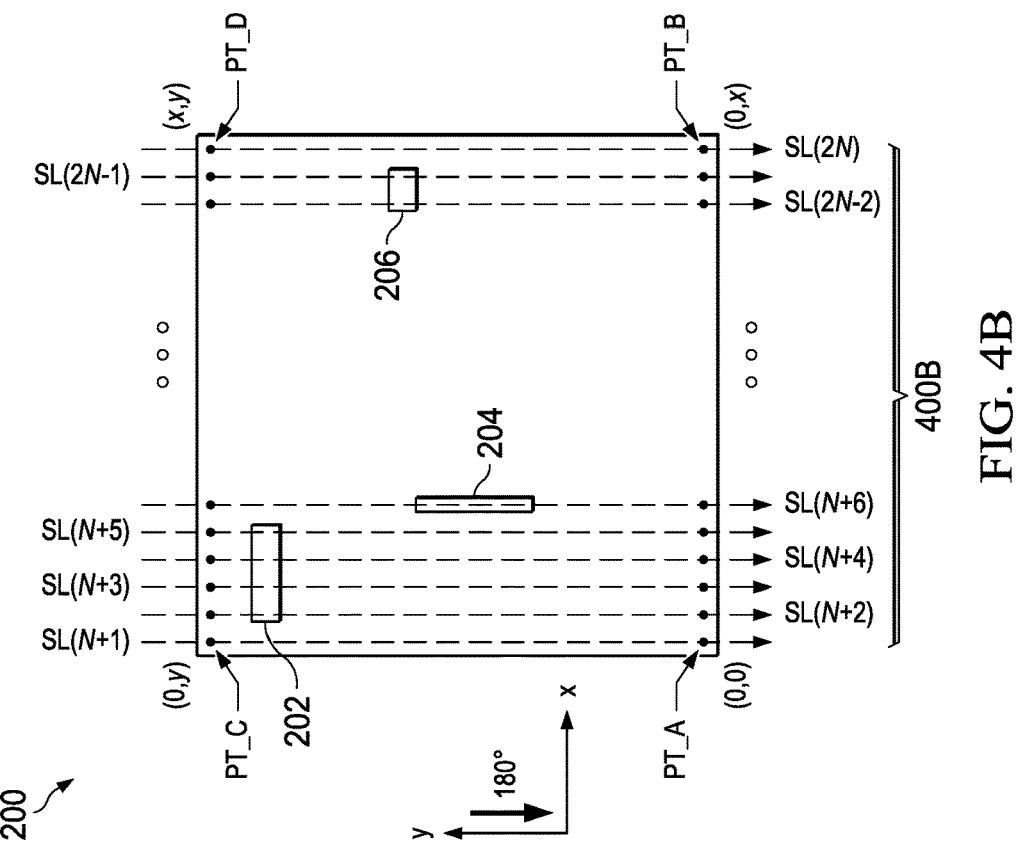
FIG. 4B illustrates a second scan set N of scan lines SL(N+1), SL(N+2), . . . , SL(2N), each in a same 180° directionality.
Figure 4A:
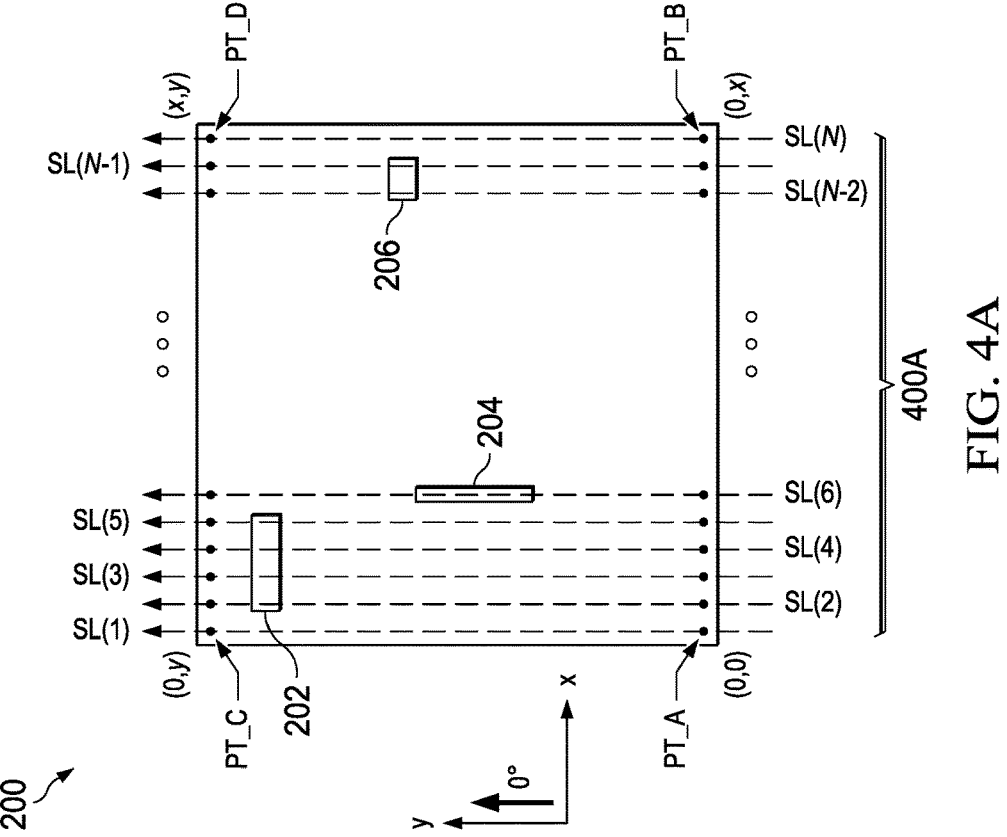
FIG. 4A illustrates a first scan set N of scan lines SL(1), SL(2), . . . , SL(N), each in a same 0° directionality.

In FIG. 4A and later figures, the origin (0, 0) is considered a directionality reference point, for example as may be determined based on a corresponding reference indicator on the semiconductor wafer 104. For example, the reference may be implemented as notch or other structural or graphical indicator on the semiconductor wafer 104, as could be included at the 6 o'clock position in FIG. 2 for example, or a reference to the positioning of the semiconductor wafer 104 relative to the edge ring 106 or the chuck 108. Given the reference point, and as shown by the FIG. 4A x-y reference plane, a first scan line SL(1) is shown as a dashed arrow, from the area of the origin (0, 0), and more particularly from the point PT A, in the y-dimension direction to and through the point PT_C, that is, in a 0° path based on the reference point.

FIG. 4A further illustrates an entire first scan set 400A, including an integer number N of scan lines that include the scan line SL(1), in which the first scan set 400A lines are consecutively indicated, from scan line SL(1), SL(2), . . . , SL(N). Each scan line SL(i) in the first scan set 400A is in a same direction as the scan line SL(1), that is, parallel to the scan line SL(1) 0° directionality. Accordingly, in the first scan set 400A, each scan line SL(i) is generally from the bottom area of the IC 200 toward the top area of the IC 200 (in the positive y-direction). Moreover, while FIG. 4A illustrates the first scan set 400A across a single IC 200, in an example embodiment the first scan set 400A is across all ICs on the semiconductor wafer 104 that are aligned in the direction of each scan line. The width of each scan line SL(i), and the distance between it and a nearest adjacent scan line SL(i+1), and accordingly the total number of scan lines N, will depend on various considerations, for example including the light wavelength used by the laser 116, and potentially other factors relating to scan overlap, sequence, and timing. Further, the sequential numbering of scan lines used in this document, that is, first scanning scan line SL(1), then next SL(2), then next SL(3), and so forth through SL(N), is not intended to limit the scope, so also contemplated is scanning out of the sequential order. In all events, certain scan lines will traverse certain of the features 202, 204, and 206, based on the location of the scan line and the shape and location of a corresponding feature. For example, scan lines SL(2), SL(3), SL(4), and SL(5) all traverse the first feature 202, scan line SL(6) traverses the second feature 204, and scan lines SL(N–2) and SL(N–1) traverse the third feature 206. And, cumulatively, the scan set 400A provide laser annealing, including corresponding dopant activation, generally across the entire area of the IC 200, with such annealing performed in the reference direction of 0°.

FIG. 4B illustrates a second scan set 400B, including number N of scan lines that, in an example embodiment, are imposed on the semiconductor wafer in addition to the FIG. 4A first scan set 400A. For example, the second scan set 400B may be performed after (or before) the first scan set 400A, and accordingly for reference, the FIG. 4B scan lines commence with SL(N+1), that is, numbering that immediately follows the scan lines SL(1) to SL(N) of the FIG. 4A first scan set 400A. Further, the sequential numbering of scan line sets as used in this document, that is, first scanning the entire first scan set 400A, then the second scan set 400B, and so forth, is also not intended to limit the scope to a sequential scanning of sets, so also contemplated is scanning sets, or even only a subset of scan lines within a set, out of a full-set followed by full-set sequential order. Using a same convention as above, in the scan set 400B the set includes scan line SL(N+1), and the additional scan lines are consecutively indicated, from scan line SL(N+1) to the scan lines SL(N+2), . . . , SL(2B). The FIG. 4B scan line SL(N+1) of the second scan set 400B is colinear with, but in the opposite direction of, the 0° oriented scan line SL(1) of the FIG. 4A first scan set 400A, that is, the scan line SL(N+1) has a 180° path based on the origin reference point, as also indicated in the FIG. 4B x-y reference plane. Further, each scan line SL(i) in the second scan set 400B is in a same direction as the scan line SL(N+1), that is, parallel to the 180° SL(N+1) directionality. Accordingly, in the second scan set 400B, each scan line SL(i) is generally from the top area of the IC 200 toward the bottom area of the IC 200 (in the negative y-direction). Further, in an example embodiment, each second set 400B scan line is colinear with, but in opposite direction to, a respective first set 400A scan line; as examples, the FIG. 4B 180° scan line SL(N+2) is colinear with, but in a 180° direction opposite of, the FIG. 4A 0° scan line SL(2), the FIG. 4B 180° scan line SL(N+3) is colinear with, but in a 180° direction opposite of, the FIG. 4A 0° scan line SL(3), and so forth. Further, again certain scan lines will traverse certain of the features 202, 204, and 206, based on the location of the scan line and the shape and location of a corresponding feature, but the second scan set 400B scan lines will heat along a 180° directionality. For example, returning to FIG. 4A, each of scan lines SL(2), SL(3), SL(4), and SL(5) traverses the first feature 202 after first traversing a relatively lengthy path along the IC 200 before reaching the first feature 202, since the scan starts at the bottom area of the IC 200 (y=0 location) and the first feature 202 is located relatively distant in the y-dimension from that start area; in contract, in FIG. 4B, each of scan lines SL(2), SL(3), SL(4), and SL(5) traverses the first feature 202 after previously traversing a relatively short path along the IC 200 before reaching the first feature 202, since the scan starts at the top area of the IC 200 (distant from y=0), and the first feature 202 is located relatively close to where that scan starts, relative to the outer boundary of the IC 200. Accordingly, it is expected that the accumulated heat in the scan path, as the first feature 202 is traversed, will differ in the scan line SL(1) as compared to the scan line SL(N+1). These same observations can be made for the other FIG. 4B scan lines that traverse the first feature 202, namely, scan lines SL(N+2), SL(N+3), SL(N+4), and SL(N+5). Likewise, comparable observations can be made with respect to the second and third features 204 and 206. For example, in the FIG. 4A first scan set 400A, the scan line SL(6) traverses the second feature 204 from the bottom area of the IC 200 area to its top, while in the FIG. 4B second scan set 400B, the scan line SL(N+6) traverses the second feature 204 from the top area of the IC 200 to its bottom area, by which each scan path may impart a different accumulated heat on the second feature 204. Lastly a similar observation can be made with respect to the third feature 206, scanned in one direction by scan lines SL(N–1) and SL(N–2) in FIG. 4A, and by the opposite-direction and colinear scan lines SL(2N–1) and SL(2N–2) in FIG. 4B.

The preceding describes and illustrates the first scan set 400A and the second scan set 400B relative to a same coordinate plane, for example with the origin (0, 0) at the lower left corner of each illustration. In an example implementation, however, the two scan sets, each with a plurality of scan lines colinear with, but in opposing direction of, scan lines in the other set, can be implemented by rotating the semiconductor wafer 104 (and its reference point) by 180°. So, as an alternative to the illustrated difference between FIG. 4A in which scan lines are generally south-to-north and FIG. 4B in which scan lines are generally north-to-south, an alternative implementation is, following the FIG. 4A south-to-north scan set, rotating the semiconductor wafer 104 (and IC 200) by 180°, in which case its origin (0, 0) would appear at the top right corner (rather than lower left as shown in FIG. 4B), and then scanning the second set of scan lines in the same south-to-north directionality shown in FIG. 4A. So in this alternative, and again using a FIG. 2 example if a notch were at the 6 o'clock position, then the first set of scan lines is performed in that position, and then the semiconductor wafer 104 is rotated 180° so that the notch would be at the 12 o'clock position for the second set of scan lines. In this alternative, each line in the second set of scan lines traces over (is colinear with) a respective line from the first set of scan lines, with the trace, insofar as the contact and traversal of the surface of the semiconductor wafer 104 is concerned, being in an opposite direction as compared to the trace from the first set. Accordingly, the second set of traces would begin with a first scan line SL(N+1) which would be colinear with, but in opposite direction, as the FIG. 4A final scan line SL(N), and a next trace SL(N+2) which would be colinear with, but in opposite direction, as the FIG. 4A next-to-last scan line SL(N−1), through the final second set trace which would be scan line SL(2N) which would be colinear with, but in opposite direction, as the FIG. 4A first scan line SL(1). Accordingly, FIG. 4A can be achieved with the semiconductor wafer 104 reference point in a first position, and then FIG. 4B can be achieved with the semiconductor wafer 104 reference point in a second position, with the second position 180° different from the first position.

Figure 4C:
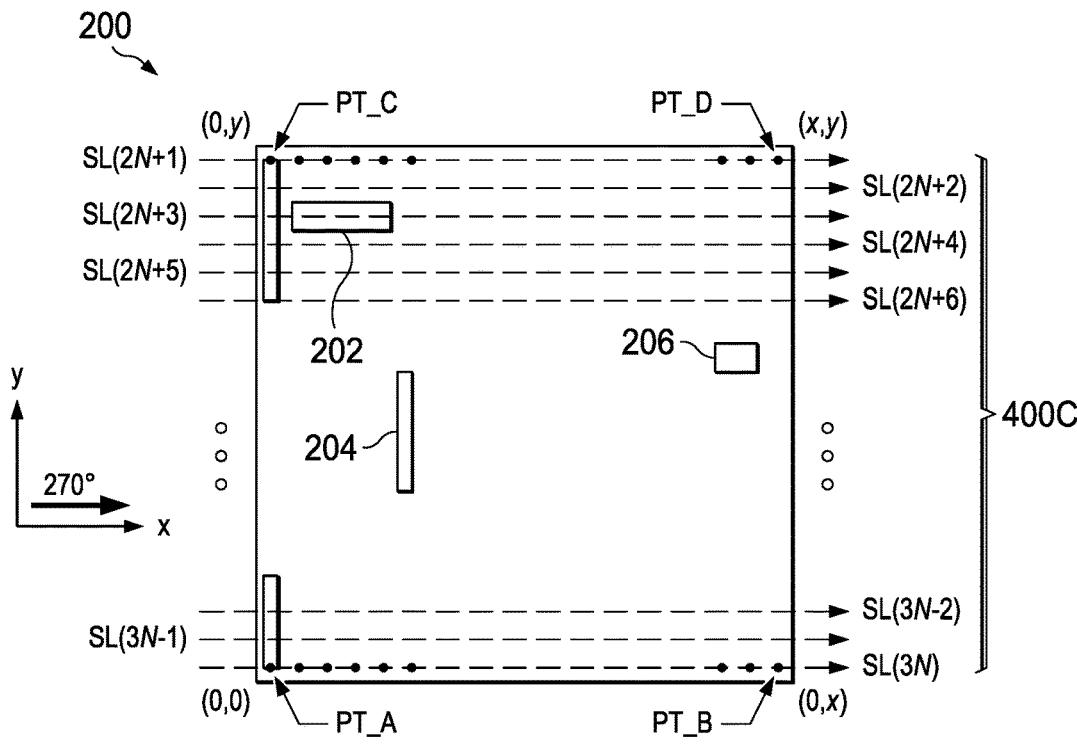
FIG. 4C illustrates a third scan set N of scan lines SL(2N+1), SL(2N+2), . . . , SL(3N), each in a same 270° directionality.

FIG. 4C illustrates a third scan set 400C, again including the number N of scan lines imposed on the IC 200 (and the semiconductor wafer 104). In an example embodiment, the scan lines of the third scan set 400C are applied to the IC 200 either in lieu of, or in addition to, the FIG. 4A first scan set 400A and the FIG. 4B second scan set 400B. For example, when the third scan set 400C is in addition to the first and second scan sets 400A and 400B, and for sake of convention, FIG. 4C illustrates a first scan line SL(2N+1), that is, numbering that immediately follows the scan lines SL(1) to SL(N) of the first scan set 400A and the scan lines SL(N+1) to SL(2N) of the second scan set 400B. The additional FIG. 4C scan lines are consecutively indicated, from scan line SL(2N+1), SL(2N+2), . . . , SL(3N). In the third scan set 400C, each of the scan lines is only in the x-dimension. For example, the scan line SL(2N+1) is in the direction from the point PT_C to the point PT_D, that is, in a 270° direction relative to the x-y reference plane. Each additional scan line SL(i) in the third scan set 400C is in a same direction as the scan line SL(2N+1), that is, parallel to the 180° scan line SL(2N+1) directionality. Accordingly, in the third scan set 400A, each scan line SL(i) is generally from the left area of the IC 200 toward the right area of the IC 200 (in the positive x-direction).

The positive x-direction paths of each scan line SL(i) in the third scan set 400C cause a different heat profile to be imposed on each of the features 202, 204, and 206, as compared to the respective heat profile for each scan line of the first and second scan sets 400A and 400B. For example, with respect to the first feature 202, it is traversed in FIG. 4C in the x-direction, by a single scan line SL(2N+3), as compared to plural scan lines scanning in the y-direction in either of the first and second sets 400A and 400B in FIGS. 4A and 4B, respectively. In practice, a feature is likely to be large enough that it will be traversed by more than one scan line, but the relative number of traversing scan lines can differ for scan lines in a first set of scan lines (e.g., FIG. 4A or 4B) relative to a second set that scan in a direction orthogonal (e.g., FIG. 4C or 4D) relative to the first set. Accordingly, depending on the location and orientation of the feature, and the approaching direction of the scan line, the scan line imposes a different heat profile to the feature, as the laser heat traverses the feature. Similar observations pertaining to other scan lines and features will be appreciated by a person of skill in the art, given this document's teachings.

Figure 4D:
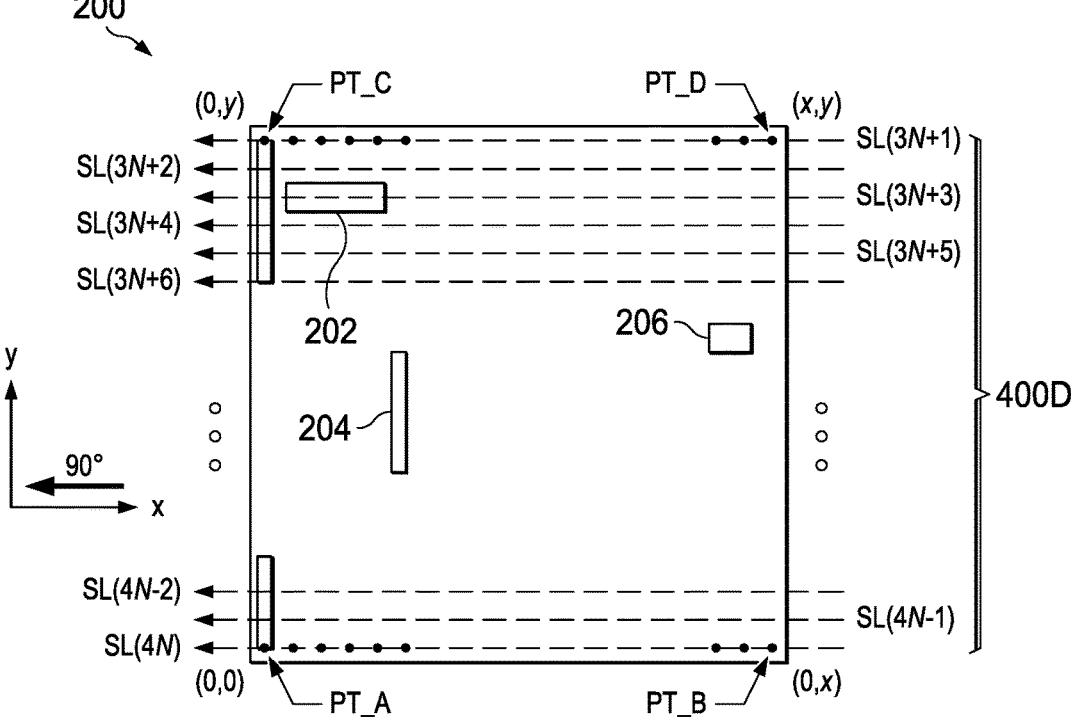
FIG. 4D illustrates a fourth scan set N of scan lines SL(3N+1), SL(3N+2), . . . , SL(4N), each in a same 90° directionality.
Figure 5A:
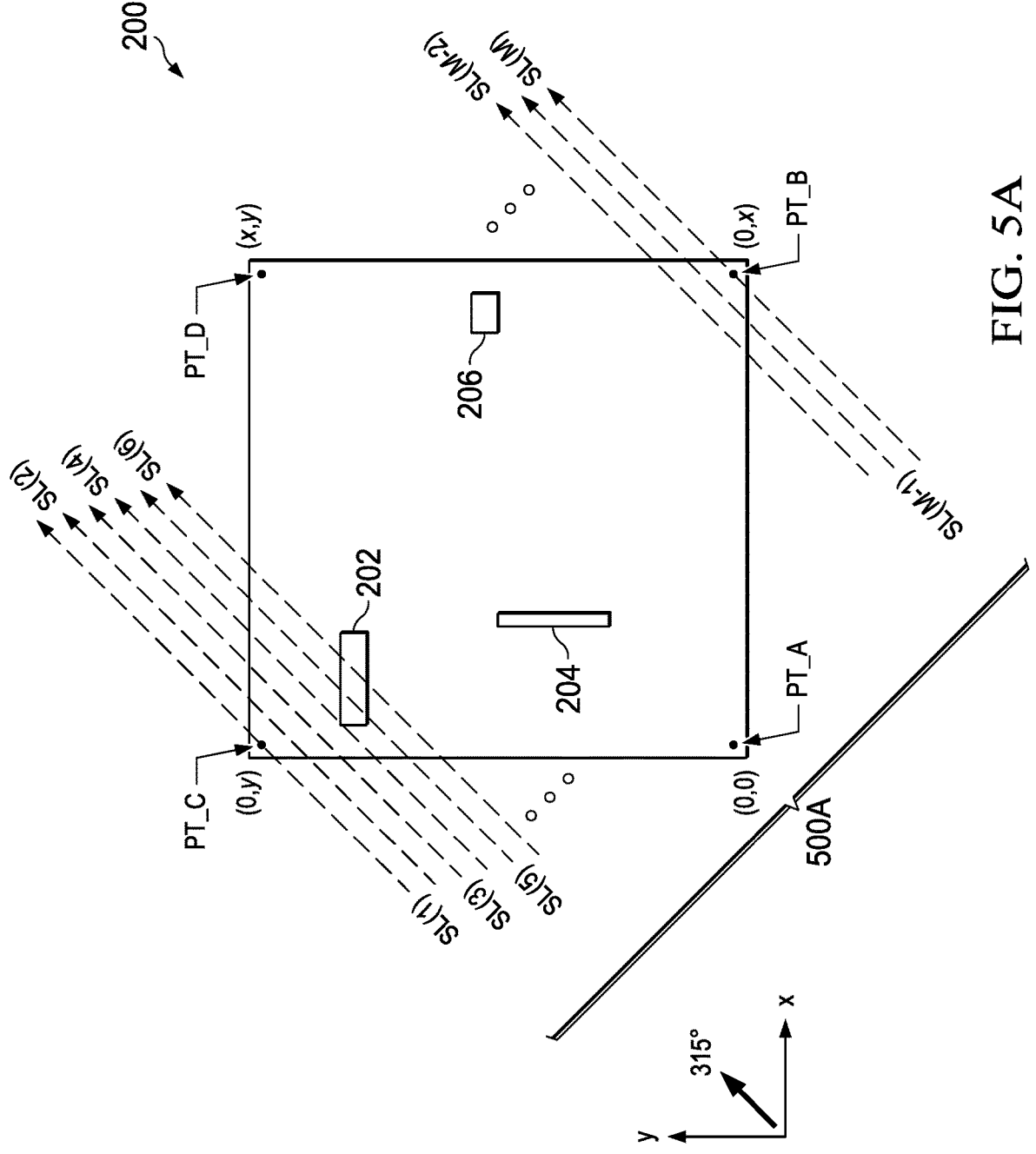
FIG. 5A illustrates a first scan set M of scan lines SL(1), SL(2), . . . , SL(M), each in a same 315° directionality.
Figure 5B:
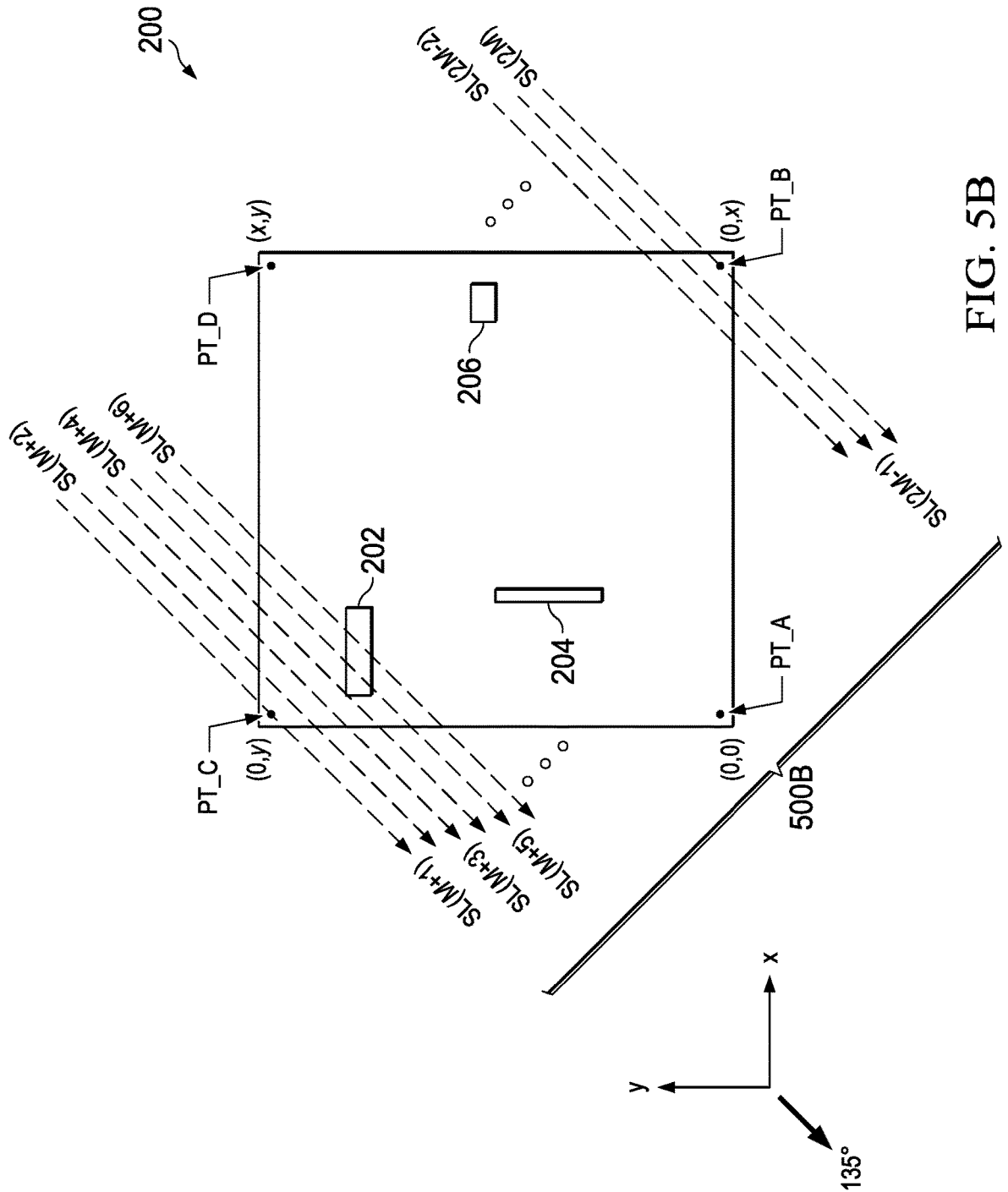
FIG. 5B illustrates a second scan set M of scan lines SL(M+1), SL(M+2), . . . , SL(2M), each in a same 135° directionality.
Figure 5C:
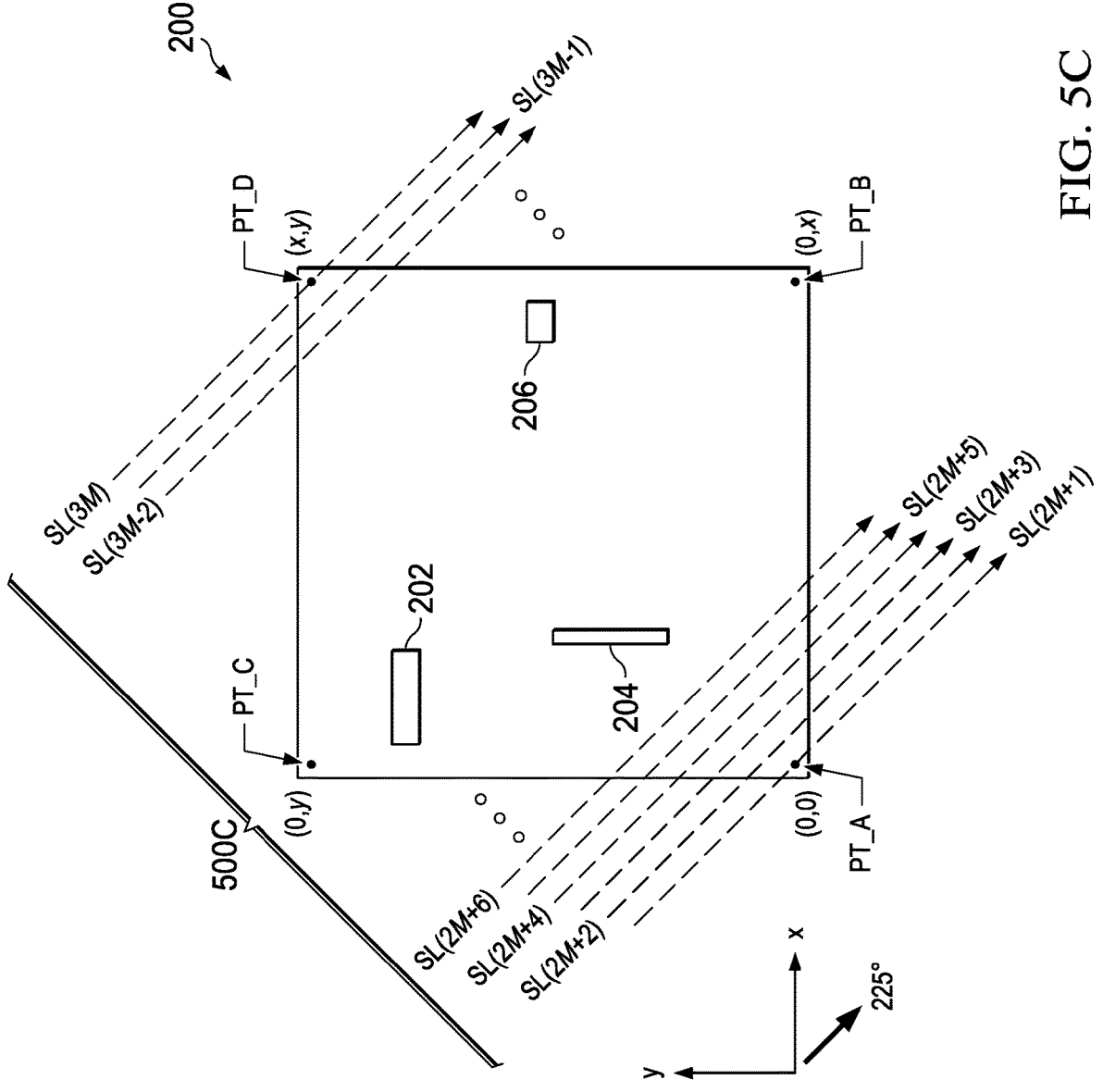
FIG. 5C illustrates a third scan set M of scan lines SL(2M+1), SL(2M+2), . . . , SL(3M), each in a same 225° directionality.
Figure 5D:
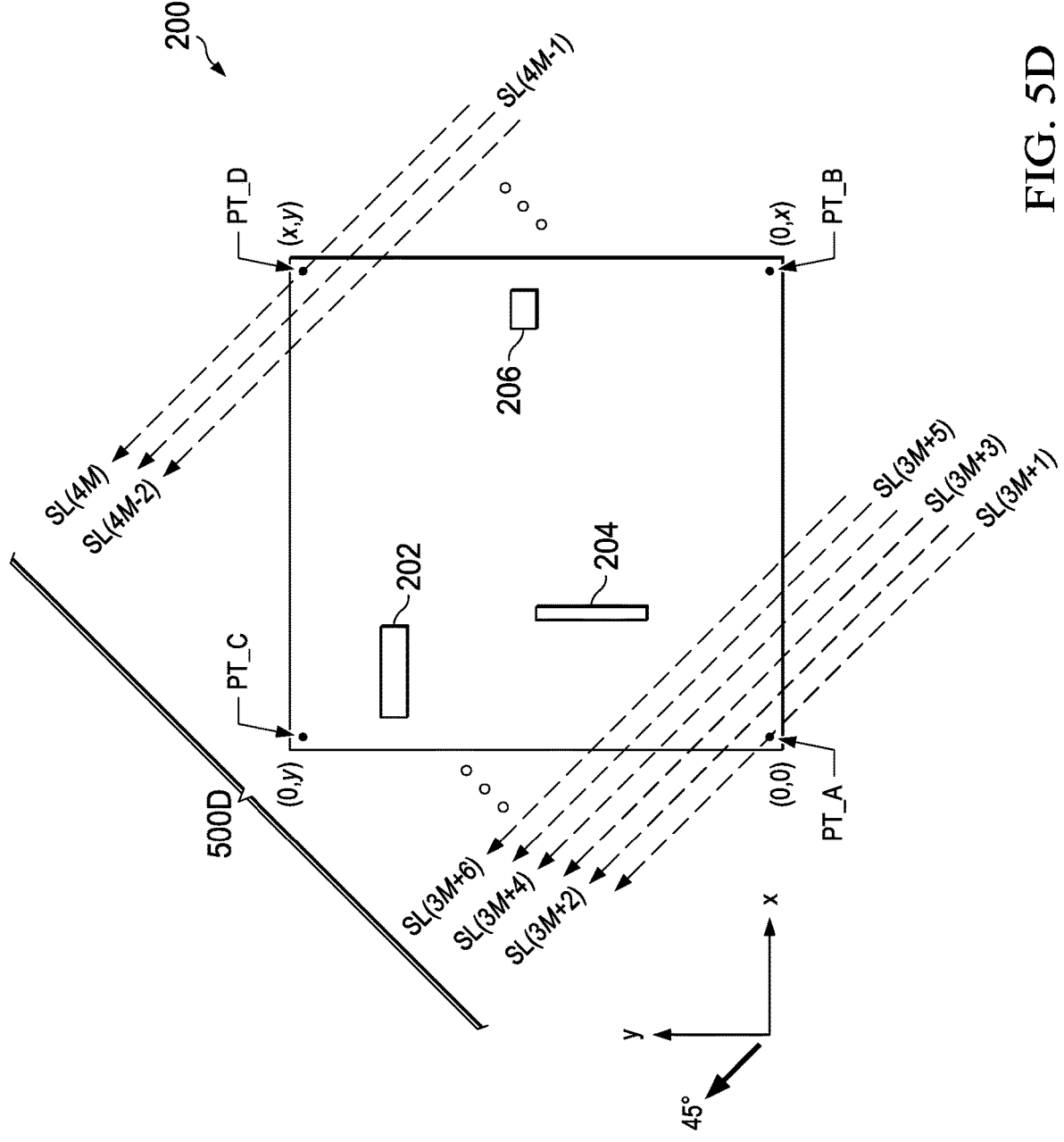
FIG. 5D illustrates a fourth scan set M of scan lines SL(3M+1), SL(3M+2), . . . , SL(4M), each in a same 45° directionality.

FIG. 4D illustrates a fourth scan set 400D, including the number N of scan lines that, in an example embodiment, are imposed on the IC 200 (and the semiconductor wafer 104)

in addition to the FIG. 4C third scan set 400C. For example, the fourth scan set 400D may be performed after the third scan set 400C, and accordingly for reference the FIG. 4D scan lines commence with SL(3N+1), that is, numbering that immediately follows the scan lines SL(2N+1) to SL(3N) of the third scan set 400C. Using a same convention as above, in the fourth scan set 400D, the set includes scan line SL(3N+1), and the additional scan lines are consecutively indicated, as SL(3N+2), . . . , SL(4N). The scan line SL(3N+1) of the fourth scan set 400D is colinear with, but in the opposite direction of, the 270° oriented scan line SL(2N+1) of the third scan set 400C, that is, the scan line SL(3N+1) has a 90° path based on the origin reference point, as also indicated in the FIG. 4D x-y reference plane. Further, each scan line SL(i) in the fourth scan set 400D is in a same direction as the scan line SL(3N+1), that is, parallel to the 90° SL(3N+1) directionality. Accordingly, in the fourth scan set 400D, each scan line SL(i) is generally from the right area of the IC 200 toward the left area of the IC 200 (in the negative x-dimension). Further, in an example embodiment, each fourth set 400D scan line is colinear with, but in opposite direction to, a respective third set 400C scan line; as examples, the FIG. 4D 90° scan line SL(3N+2) is colinear with, but in a 180° direction opposite of, the FIG. 4C 270° scan line SL(2N+2), the FIG. 4D 90° scan line SL(3N+3) is colinear with, but in a 180° direction opposite of, the FIG. 4C 270° scan line SL(2N+3), and so forth. Again, certain scan lines will traverse certain of the features 202, 204, and 206, based on the location of the scan line and the shape and location of a corresponding feature, but the fourth scan set 400D scan lines will heat along a 90° directionality, so opposite of the third scan set 400C. For example with respect to the first feature 202, in FIG. 4C, it is traversed by the scan line SL(2N+3) after a relatively short path along the IC 200 before reaching the first feature 202, since the scan starts at the left area of the IC 200 (x=0 location) and the first feature 202 is located relatively close in the x-dimension on the IC 200; in contract, in FIG. 4D, the scan line SL(3N+3) traverses the first feature 202 after previously traversing a relatively long path along the IC 200 before reaching the first feature 202, since the scan starts at the right area of the IC 200 (x distant from x=0) and the first feature 202 is located relatively close to where that scan ends, relative to the outer boundary of the IC 200. Accordingly, again it is expected that the accumulated heat in the scan path, as the first feature 202 is traversed, will differ in the scan line SL(2N+3) as compared to the scan line SL(3N+3). Comparable observations can be made for the other FIG. 4D scan lines features.

The preceding description and illustration of the third and fourth scan sets 400C and 400D also may be achieved, comparably to the alternative set forth above with respect to the first and second scan sets 400A and 400B, again by rotating the semiconductor wafer 104. For example, to achieve the trace direction of FIG. 4C, the semiconductor wafer 104 can be rotated 270° counterclockwise relative to FIG. 4A. As another example, to achieve the trace direction of FIG. 4D, the semiconductor wafer 104 can be rotated 90° counterclockwise relative to FIG. 4A (or 180° relative to FIG. 4C). In these implementations, and as described earlier for FIG. 4B as rotated compared to FIG. 4A, again the sequencing of each scan line in a scan set will be in the opposite sequence as the opposing scan set (what is the first line scanned in one set will be the last line scanned in the opposing direction set).

FIGS. 5A, 5B, 5C, and 5D illustrate respective scan sets 500A, 500B, 500C, and 500D, each with a total of M scan lines SL(i=1, . . . , M), in connection with additional example embodiments. For example, the scan sets 500A and 500B are each rotated 45° clockwise, respectively, relative to the FIGS. 4A and 4B scan sets 400A and 400B. Accordingly, in one example embodiment, the IC 200 is scanned with the scan sets 500A and 500B. In this example, for each scan line SL(i) in the sets 500A and 500B, a first scan from the scan set 500A is along a 315° path relative to, or parallel to another scan from, the origin (0, 0), while a corresponding and second scan from the scan set 500B is in the opposite direction, along a 135° path, where the first and second scan paths are colinear, that is, traversing the same line (and feature(s)) across the IC 200. As another example, the scan sets 500C and 500D are each rotated 45° clockwise, respectively, relative to the FIGS. 4C and 4D scan sets 400C and 400D. Accordingly, in another example embodiment, the IC 200 is scanned with the scan sets 500C and 500D, again with each set having a scan line that is colinear with a scan line from the other set, and all lines along a path, or parallel to, a scan line SL(i) that is either 45° or 225° direction relative to, or parallel to another scan from, the origin (0, 0). As yet another example embodiment, the IC 200 may be scanned per all four sets 500A, 500B, 500C, and 500D, thereby providing a first two sets in the 135° or 315° directions, and a second two other sets scanning orthogonally to the first two sets, namely, in the 45° or 225° directions. Further, for FIGS. 5A through 5D, as in the case for FIGS. 4A through 4D, the sequential numbering of scan lines, or the sequential discussion of scan sets, is not intended to limit the scope to a sequential scanning within a set or to complete one set before scanning a part or all of a next set, and also the FIGS. 5A through 5D scan lines, with different sequencing order, can be implemented by keeping the laser beam in one direction will rotating the semiconductor wafer 104 for each different scan set. Lastly, a selection between sets from FIGS. 4A through 4D, or instead from FIGS. 5A through 5D, may be based on various considerations. For example, many contemporary IC topologies include rectangular-like 'blocks,' often oriented in what has been introduced above as the x- and y-dimensions, that is, with a major axis in the direction of 0° and 180°, or of 90° and 270°. For topologies with an amount of such a layout beyond a threshold (that may be set by one skilled in the art), the scans of FIGS. 5A and 5B, or 5C and 5D, or all of FIGS. 5A through 5D, may be more desirable than those in FIGS. 4A through 4D, as the FIGS. 5A through 5D scan path is ±45° relative to such a major axis. Accordingly, as the ±45° scan traverses a feature that is predominantly positioned in the x/y-dimension, the scan may incur a lesser amount of a certain type of the feature area, as compared to a FIGS. 4A through 4D scan. For example, the lesser area may correspond to a lesser contact with heat generating features, such as high-density polysilicon and, accordingly, the potential for inconsistent heat application, due to heat accumulation along the scan, might be favorably reduced.

FIG. 6 illustrates a flow diagram of an example embodiment method 600 for manufacturing the FIG. 2 IC 200, including a summarization of scan line options described above. The flow diagram 600 begins in a step 602, in which the FIG. 1 semiconductor wafer 104 is obtained. The semiconductor wafer 104, at this stage, may be a bare wafer or may have one or more semiconductor features already formed on it. The semiconductor wafer 104 also includes a plurality of IC regions.

Thereafter, in a step 604, one or more additional semiconductor features are formed on or in a layer(s) of the semiconductor wafer 104, with like copies of each feature formed into each respective IC 200 on the semiconductor wafer 104. The step 604 of forming the one or more additional semiconductor features may include almost any process used to form any feature, but for purposes of example embodiments includes implantation of dopants that require, or benefit from, a subsequent anneal step, for example to activate dopants and/or repair implantation defects. The step 604 also may include other process steps, or a collection of different process steps, so that eventually the features 202, 204, and 206, shown in various above-described figures, are formed for each IC 200 on the semiconductor wafer 104.

After step 604, in a step 606, laser annealing is performed across the IC 200. In an example embodiment, the laser annealing includes at least two sets of laser scans, a first set having a number of parallel scan lines in a first direction, and a second set having a number (for example, the same number as in the first set) of parallel scan lines in a second direction, in which each scan line in the first set has a corresponding and colinear, but opposite direction, scan line in the second set. For example, the step 604 may be implemented using the FIGS. 4A and 4B scan sets 400A and 400B, the FIGS. 4C and 4D scan sets 400C and 400D, the FIGS. 5A and 5B scan sets 500A and 500B, or the FIGS. 5C and 5D scan sets 500C and 500D.

After the step 606, the method 600 includes an option to proceed to an optional step 608, or to bypass the optional step 608 and proceed with a step 610. In the optional step 608, laser annealing is again performed across the IC 200, with two additional sets of laser scans, in addition to those in the step 606, where each of the two additional sets of laser scans includes scan lines that are orthogonal to a respective set of the step 606 scan lines. For example, if the step 606 laser annealing is performed using the FIGS. 4A and 4B scan sets 400A and 400B, then the step 608 scans are performed using the FIGS. 4C and 4D scan sets 400C and 400D. As another example, if the if the step 606 laser annealing is performed using the FIGS. 5C and 5D scan sets 500C and 500D, then the step 608 scans are performed using the FIGS. 5A and 5B scan sets 500A and 500B. Other examples will be ascertainable by a person of skill in the art, given this document's teachings.

After the step 608, or from the step 606 if the option of the step 608 is not taken, in a step 610, various other processing steps may be performed in connection with features that do not require laser annealing, and at different layers. Thereafter, one or more of the ICs 200 on the semiconductor wafer 104 is then tested.

After the step 610, in a step 612 each IC 200 is cut (diced) from the semiconductor wafer 104. In the step 612, each IC 200 may be separated according to different groups or bins, where each bin receives any IC having a test result within a corresponding performance range. Further, any IC 200 in a bin having an unacceptably low performance may be discarded, that is, not shipped as usable product to customers, but may be retained internally for additional testing, or it may be destroyed or otherwise used.

Finally, in a step 614 following the step 612, each performance-acceptable IC 200 is packaged. Packaging typically places a casing around (or encapsulating) the IC and further provides an external interface, typically a number of conductive pins, fixed relative to pads on the die, and conductors such as wire bonds, lands, or balls, are formed between the IC pads and the packaging pins. Thereafter, any packaged IC with an acceptable memory test result is ready for sale and shipping to a customer.

From the above, one skilled in the art should appreciate that example embodiments are provided for IC semiconductor fabrication, for example with respect to IC laser annealing. Such embodiments provide various benefits, some of which are described above and including still others. For example, example embodiments permit various alternatives for laser anneal scan paths across an IC. Example embodiments also provide for scanning an IC in two, opposite but colinear, directions, for example with plural scans in a set in one direction, and plural scans in another set in the opposite, but colinear direction. In using opposite and colinear scanning, example embodiments may have improved uniformity of heat across an IC, or across an entire wafer and its plural ICs. With more uniform heat, more uniform performance is anticipated for each like feature on each like IC of the wafer. Still another benefit is that the number of scan paths may vary, as may the number or directionality, including either opposite direction paths, or both opposite direction and orthogonal direction (including opposite directions within the orthogonal) scanning, where person of skill in the art may choose among the options based on various considerations, and where some choices may be more favorable than others in certain contexts. As a final example, additional modifications are possible in the described embodiments, and other embodiments are possible, within the scope of the following claims.

What is claimed is:

1. A method of forming an integrated circuit, the method comprising:

positioning a semiconductor wafer in a processing chamber; and laser annealing at least a portion of the semiconductor wafer, including:

applying a first laser beam in a first direction along a scan path across the at least a portion of the semiconductor wafer; and applying a second laser beam in a second direction along the same scan path, opposite to the first direction, across the at least a portion of the semiconductor wafer.

2. The method of claim 1 wherein the at least a portion of the semiconductor wafer includes a dopant implanted feature in the semiconductor wafer.

3. The method of claim 2 wherein the dopant implanted feature includes a portion of a transistor or resistor.

4. The method of claim 1, wherein the laser annealing further includes:

applying a third laser beam, in a third direction along another scan path, the third direction orthogonal to the first direction and the second direction, across the at least a portion of the semiconductor wafer; and applying a fourth laser beam, in a fourth direction along the same other scan path, opposite to the third direction, across the at least a portion of the semiconductor wafer.

5. The method of claim 4 wherein the at least a portion of the semiconductor wafer includes a dopant implanted feature in the semiconductor wafer.

6. The method of claim 5 wherein the dopant implanted feature includes a portion of a transistor or resistor.

7. The method of claim 4, and further including:

applying a first set of laser beams, the first set including the first laser beam, in the first direction;

applying a second set of laser beams, the second set including the second laser beam, in the second direction;

applying a third set of laser beams, the third set including the third laser beam, in the third direction; and applying a fourth set of laser beams, the fourth set including the fourth laser beam, in the fourth direction.

8. The method of claim 7:

wherein each laser beam in the first set of laser beams traverses a respective scan path that is parallel to at least one other scan path corresponding to at least one other laser beam in the first set of laser beams;

wherein each laser beam in the second set of laser beams traverses a respective scan path that is parallel to at least one other scan path corresponding to at least one other laser beam in the second set of laser beams;

wherein each laser beam in the third set of laser beams traverses a respective scan path that is parallel to at least one other scan path corresponding to at least one other laser beam in the third set of laser beams; and wherein each laser beam in the fourth set of laser beams traverses a respective scan path that is parallel to at least one other scan path corresponding to at least one other laser beam in the fourth set of laser beams.

9. The method of claim 1, and further including:

applying a first set of laser beams, the first set including the first laser beam, in the first direction; and applying a second set of laser beams, the second set including the second laser beam, in the second direction.

10. The method of claim 1 wherein the at least a portion of the semiconductor wafer includes an integrated circuit area on the semiconductor wafer.

11. The method of claim 10:

wherein the integrated circuit has an integrated circuit feature with a major axis; and wherein the scan path traverses a 45 degree angle across the major axis.

12. The method of claim 10:

wherein the integrated circuit has an integrated circuit feature with a major axis; and wherein the scan path is parallel to the major axis.

13. The method of claim 1 wherein the at least a portion of the semiconductor wafer includes plural integrated circuit areas on the semiconductor wafer.

14. A method of forming an integrated circuit, the method comprising:

positioning a semiconductor wafer in a processing chamber; and laser annealing a linear portion of the semiconductor wafer, the laser annealing comprising:

applying a first laser annealing beam in a first direction along a scan path across the linear portion of the semiconductor wafer; and applying a second laser annealing beam in a second direction along the same scan path across the linear portion of the semiconductor wafer, wherein the second direction is colinear with and opposite to the first direction.

15. The method of claim 14, wherein applying the first laser annealing beam imparts a first accumulated heat, and the application of the second laser annealing beam imparts a second accumulated heat that is different from the first accumulated heat.

16. The method of claim 14, wherein the laser annealing further comprises:

applying a third laser annealing beam in a third direction along another scan path across another linear portion of the semiconductor wafer, wherein the third direction is orthogonal to the first direction and the second direction; and applying a fourth laser annealing beam in a fourth direction along the same other scan path across the other linear portion of the semiconductor wafer, wherein the fourth direction is colinear with and opposite to the third direction.

17. The method of claim 16, wherein the first laser annealing beam and the second laser annealing beam are associated with a first heat profile, and wherein the third laser annealing beam and the fourth laser annealing beam are associated with a second heat profile.

18. A method of forming an integrated circuit, the method comprising:

positioning a semiconductor wafer in a processing chamber; and laser annealing one or more portions of the semiconductor wafer by:

applying a first laser beam in a first direction along a first scan path across a first portion of the one or more portions of the semiconductor wafer;

applying a second laser beam in a second direction along the same first scan path across the first portion of the semiconductor wafer, wherein the second direction is opposite to the first direction;

applying a third laser beam in a third direction along a second scan path across a second portion of the one or more portions of the semiconductor wafer, wherein the third direction is orthogonal to the first direction and the second direction; and applying a fourth laser beam in a fourth direction along the same second scan path across the second portion of the semiconductor wafer, wherein the fourth direction is opposite to the third direction.

19. The method of claim 18, wherein:

a given point of the first portion of the semiconductor wafer is shared by the first direction and the second direction;

applying the first laser beam imparts a first accumulated heat on the given point; and applying the second laser beam imparts a second accumulated heat on the given point that is different from the first accumulated heat.

20. The method of claim 19, wherein the first laser beam and the second laser beam are associated with a first heat profile, and wherein the third laser beam and the fourth laser beam are associated with a second heat profile.

* * * * *